(12) United States Patent
Wu et al.

(10) Patent No.: US 8,361,350 B2
(45) Date of Patent: Jan. 29, 2013

(54) SILVER NANOPARTICLE INK COMPOSITION

(75) Inventors: Yiliang Wu, Oakville (CA); Ping Liu, Mississauga (CA); Nan Xing Hu, Oakville (CA)

(73) Assignee: Xerox Corporation, Norwalk, CT (US)

( * ) Notice: Subject to any disclaimer, the term of this patent is extended or adjusted under 35 U.S.C. 154(b) by 961 days.

(21) Appl. No.: 12/331,573

(22) Filed: Dec. 10, 2008

(65) Prior Publication Data
US 2010/0143591 A1   Jun. 10, 2010

(51) Int. Cl.
*H01B 1/22* (2006.01)
(52) U.S. Cl. ..... 252/514; 252/500; 252/512; 252/519.2; 252/519.21; 252/519.3; 977/810
(58) Field of Classification Search ............ 252/500, 252/511, 512, 514, 519.2, 519.21, 519.3; 977/810
See application file for complete search history.

(56) References Cited

U.S. PATENT DOCUMENTS

| 6,878,184 | B1* | 4/2005 | Rockenberger et al. ........ 75/343 |
| 7,270,694 | B2* | 9/2007 | Li et al. ......................... 75/351 |
| 2009/0029148 | A1* | 1/2009 | Hashimoto et al. ........... 428/323 |
| 2009/0181172 | A1* | 7/2009 | Parpia et al. .................. 427/256 |

OTHER PUBLICATIONS

Printed Silver Ohmic Contacts for High-Mobility Organic Thin-Film Transistors, JACS, Wu et al., vol. 128, No. 13, 2006, pp. 4202-4203.*
Dan Soltman and Vivek Subramanian, "Inkjet-Printed Line Morphologies and Temperature Control of the Coffee Ring Effect", Department of Electrical Engineering and Computer Science, University of California, Berkeley, California 94720; Oct. 17, 2007; pp. 2225-2231.

* cited by examiner

*Primary Examiner* — Mark Kopec
*Assistant Examiner* — Haidung Nguyen
(74) *Attorney, Agent, or Firm* — Fay Sharpe LLP; Richard M. Klein

(57) ABSTRACT

An ink composition comprises silver nanoparticles, hydrocarbon solvent, and an alcohol co-solvent. The ink composition is suitable for printing conductive lines that are uniform, smooth, and narrow on various substrate surfaces.

19 Claims, 5 Drawing Sheets

SILVER NANOPARTICLE INK COMPOSITION

BACKGROUND

Disclosed herein, in various embodiments, are stable, high performing nanoparticle compositions suitable for printing, such as by inkjet printing, as well as processes and devices for making and/or using the same.

Fabrication of electronic circuit elements using liquid deposition techniques may be beneficial as such techniques provide potentially low-cost alternatives to conventional mainstream amorphous silicon technologies for electronic applications such as thin film transistors (TFTs), light-emitting diodes (LEDs), RFID tags, photovoltaics, etc. However, the deposition and/or patterning of functional electrodes, pixel pads, and conductive traces, lines and tracks which meet the conductivity, processing, and cost requirements for practical applications have been a great challenge. The metal, silver (Ag), is of particular interest as conductive elements for electronic devices because silver is much lower in cost than gold (Au) and it possesses much better environmental stability than copper (Cu).

Silver nanoparticles have been extensively examined. However, previous ink compositions containing silver nanoparticles have typically had poor jettability, i.e. they could not be printed using conventional inkjet printing technologies. Typically, the ink would block the nozzle, drip out or dry out on the printer head, and/or the ink droplets would misfire. The printed features had low resolution and/or suffered from the "coffee ring" effect, wherein the particles in a given droplet end up along the circumference of the circle having a center where the droplet was deposited on the substrate (i.e. a non-uniform deposition). Ideally, deposited inkjet-printed lines should be smooth, even, and straight.

Jettable ink compositions would be desirable to enable drop-on-demand deposition and printing with functional features such as electrodes and interconnects for electronic devices.

BRIEF DESCRIPTION

The present application discloses, in various exemplary embodiments, ink compositions which are suitable for printing, including inkjet printing or jetting. These ink compositions allow the formation of inkjet-printed lines which are uniform and smooth. They allow the formation of such lines at very narrow widths as well.

Disclosed in some embodiments is an ink composition comprising: silver nanoparticles; a hydrocarbon solvent; and an alcohol co-solvent.

The silver nanoparticles may be stabilized with a carboxylic acid or an organoamine. The carboxylic acid can be selected from butyric acid, pentanoic acid, hexanoic acid, heptanoic acid, octanoic acid, nonanoic acid, decanoic acid, undecanoic acid, dodecanoic acid, tridecanoic acid, myristic acid, pentadecanoic acid, palmitic acid, heptadecanoic acid, stearic acid, oleic acid, nonadecanoic acid, icosanoic acid, eicosenoic acid, elaidic acid, linoleic acid, palmitoleic acid, citronellic acid, geranic acid, undecenoic acid, lauric acid, undecylenic acid, isomers thereof, and mixtures thereof, and the organoamine can be selected from pentylamine, hexylamine, heptylamine, octylamine, nonylamine, decylamine, hexadecylamine, undecylamine, dodecylamine, tridecylamine, tetradecylamine, diaminopentane, diaminohexane, diaminoheptane, diaminooctane, diaminononane, diaminodecane, diaminooctane, dipropylamine, dibutylamine, dipentylamine, dihexylamine, diheptylamine, dioctylamine, dinonylamine, didecylamine, methylpropylamine, ethylpropylamine, propylbutylamine, ethylbutylamine, ethylpentylamine, propylpentylamine, butylpentylamine, tributylamine, trihexylamine, and mixtures thereof.

The silver nanoparticles can have a particle size from about 1 nm to about 50 nm. They can also have a low polarity surface.

The hydrocarbon solvent may be an aliphatic hydrocarbon having at least 5 carbon atoms to about 20 carbon atoms, such as pentane, hexane, heptane, octane, nonane, decane, undecane, dodecane, tridecane, tetradecane, pentadecane, hexadecane, heptadecane, dodecene, tetradecene, hexadecene, heptadecene, octadecene, terpinenes, isoparaffinic solvents, and their isomers. Alternatively, the hydrocarbon solvent can be an aromatic hydrocarbon having from about 7 carbon atoms to about 18 carbon atoms, such as toluene, xylene, ethyltoluene, mesitylene, trimethylbenzene, diethylbenzene, tetrahydronaphthalene, and ethylbenzene.

The alcohol co-solvent has at least 6 carbon atoms and can be, for example, hexanol, heptanol, octanol, nonanol, decanol, undecanol, dodecanol, tetradecanol, and hexadecanol; a diol such as hexanediol, heptanediol, octanediol, nonanediol, and decanediol; an alcohol comprising an unsaturated double bond, such as farnesol, dedecadienol, linalool, geraniol, nerol, heptadienol, tetradecenol, hexadecenol, phytol, oleyl alchohol, dedecenol, decenol, undecylenyl alcohol, nonenol, citronellol, octenol, and heptenol; a cycloaliphatic alcohol with or without an unsaturated double bond, such as methylcyclohexanol, menthol, dimethylcyclohexanol, methylcyclohexenol, terpineol, dihydrocarveol, isopulegol, trimethylcyclohexenol; and the like. In particular, the alcohol co-solvent may be a terpineol solvent comprising a majority of alpha-terpineol by weight.

The silver nanoparticles (along with stabilizer, if any) may be at least about 35 weight percent of the ink composition. In some embodiments, the silver nanoparticles are at least about 35 weight percent of the ink composition; and the weight ratio of the hydrocarbon solvent to the alcohol co-solvent is from about 5:1 to about 1:2. In other embodiments, the silver nanoparticles are at least 25 weight percent of the ink composition, and the weight ratio of the hydrocarbon solvent to the alcohol co-solvent is less than about 5:1. The weight ratio of the hydrocarbon solvent to the alcohol co-solvent may also be from about 2:1 to about 1:1.

The ink composition may have a viscosity of from about 2 to about 15 centipoise, and/or a surface tension of from about 22 to about 35 millinewtons/meter.

The boiling point of the hydrocarbon solvent sometimes is not greater than the boiling point of the alcohol co-solvent. Additionally, the silver nanoparticles may be more soluble in the hydrocarbon solvent than the alcohol co-solvent; and the alcohol co-solvent may have a higher surface tension than the hydrocarbon solvent.

Disclosed in other embodiments is an ink composition comprising: oleic acid stabilized silver nanoparticles; dodecane; and terpineol; wherein the silver nanoparticles comprise from about 35 weight percent to about 60 weight percent of the ink composition, and the weight ratio of dodecane to terpineol is from about 3:1 to about 1:1.

Disclosed in yet other embodiments is an ink composition comprising: organoamine stabilized silver nanoparticles: an isoparaffinic solvent; and terpineol; wherein the silver nanoparticles comprise from about 35 weight percent to about 60 weight percent of the ink, and the weight ratio of the isoparaffinic solvent to terpineol is from about 3:1 to about 1:1.

Also disclosed is a method of printing a line on a substrate, comprising: providing an ink composition comprising silver nanoparticles, a hydrocarbon solvent, and an alcohol co-solvent; and depositing droplets of the ink composition onto a substrate to print a line.

The ink composition may be heated to a temperature of from about 23° C. to about 45° C. The substrate may be heated to a temperature of from about 40° C. to about 80° C.

The droplets exhibit no coffee ring effect. The droplets may have an $h_{edge}/h_{center}$ ratio of about 1.0.

The line may have a width of about 100 microns or less. The width of the line can also be independent of the surface energy of the substrate.

These and other non-limiting characteristics of the disclosure are more particularly disclosed below.

BRIEF DESCRIPTION OF THE DRAWINGS

The following is a brief description of the drawings, which are presented for the purposes of illustrating the exemplary embodiments disclosed herein and not for the purposes of limiting the same.

DETAILED DESCRIPTION

Figure 1A:
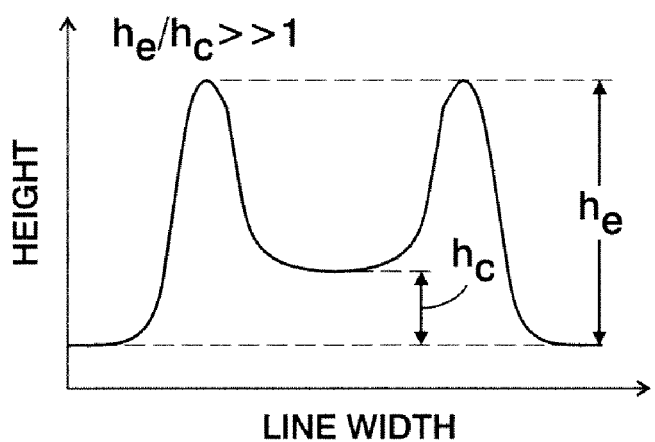
FIGS. 1A-1C illustrate a representative parameter ($h_e/h_c$) of the coffee ring effect.

A more complete understanding of the components, processes and apparatuses disclosed herein can be obtained by reference to the accompanying drawings. These figures are merely schematic representations based on convenience and the ease of demonstrating the present disclosure, and are, therefore, not intended to indicate relative size and dimensions of the devices or components thereof and/or to define or limit the scope of the exemplary embodiments.

Although specific terms are used in the following description for the sake of clarity, these terms are intended to refer only to the particular structure of the embodiments selected for illustration in the drawings, and are not intended to define or limit the scope of the disclosure. In the drawings and the following description below, it is to be understood that like numeric designations refer to components of like function.

The term "nano" as used in "silver nanoparticles" indicates a particle size of less than about 1000 nm. In embodiments, the silver nanoparticles have a particle size of from about 0.5 nm to about 1000 nm, from about 1 nm to about 500 nm, from about 1 nm to about 100 nm, and particularly from about 1 nm to about 20 nm. The particle size is defined herein as the average diameter of the silver nanoparticles, as determined by TEM (transmission electron microscopy).

The modifier "about" used in connection with a quantity is inclusive of the stated value and has the meaning dictated by the context (for example, it includes at least the degree of error associated with the measurement of the particular quantity). When used in the context of a range, the modifier "about" should also be considered as disclosing the range defined by the absolute values of the two endpoints. For example, the range "from about 2 to about 4" also discloses the range "from 2 to 4."

The ink compositions of the present disclosure comprise (1) silver nanoparticles; (2) a hydrocarbon solvent; and (3) an alcohol co-solvent.

The silver nanoparticles may have an average diameter of about 100 nanometers or less, preferably about 50 nanometers or less. In some specific embodiments, the nanoparticles have an average diameter of from about 1 nanometer to about 15 nanometers, including from about 2 nanometers to about 10 nanometers. In addition, the particle size distribution width refers to the difference between the diameter of the largest nanoparticle and the diameter of the smallest nanoparticle, or the range between the smallest and largest nanoparticles. In some embodiments, the particle size distribution width of the silver nanoparticles may be from about 10 nanometers to about 50 nanometers, or from about 10 nanometers to about 25 nanometers. In further embodiments, the silver nanoparticles have small particle sizes from about 1 nanometers to about 50 nanometers and a narrow size distribution width of from about 10 nanometers to about 30 nanometers. Without being limited by theory, it is believed that small particle sizes with a narrow size distribution width make the nanoparticles easier to disperse when placed in a solvent.

In embodiments, the silver nanoparticles are composed of elemental silver or a silver composite. Besides silver, the silver composite may include either or both of (i) one or more other metals and (ii) one or more non-metals. Suitable other metals include, for example, Al, Au, Pt, Pd, Cu, Co, Cr, In, and Ni, particularly the transition metals, for example, Au, Pt, Pd, Cu, Cr, Ni, and mixtures thereof. Exemplary metal composites are Au—Ag, Ag—Cu, Au—Ag—Cu, and Au—Ag—Pd. Suitable non-metals in the metal composite include, for example, Si, C, and Ge. The various components of the silver composite may be present in an amount ranging for example from about 0.01% to about 99.9% by weight, particularly from about 10% to about 90% by weight. In embodiments, the silver composite is a metal alloy composed of silver and one, two or more other metals, with silver comprising, for example, at least about 20% of the nanoparticles by weight, particularly greater than about 50% of the nanoparticles by weight.

The silver nanoparticles may be stabilized on their surface by a carboxylic acid or an organoamine. The carboxylic acid generally has from 4 to about 20 carbon atoms. Exemplary carboxylic acids include butyric acid, pentanoic acid, hexanoic acid, heptanoic acid, octanoic acid, nonanoic acid, decanoic acid, undecanoic acid, dodecanoic acid, tridecanoic acid, myristic acid, pentadecanoic acid, palmitic acid, heptadecanoic acid, stearic acid, oleic acid, nonadecanoic acid, icosanoic acid, eicosenoic acid, elaidic acid, linoleic acid, palmitoleic acid, citronellic acid, geranic acid, undecenoic acid, lauric acid, undecylenic acid, isomers thereof, and mixtures thereof. The organoamine may be a primary, secondary, or tertiary amine. The organoamine generally has from 3 to about 20 carbon atoms. Exemplary organoamines include propylamine, butylamine, pentylamine, hexylamine, heptylamine, octylamine, nonylamine, decylamine, undecylamine, dodecylamine, tridecylamine, tetradecylamine, pentadecylamine, hexadecylamine, heptadecylamine, octadecylamine, N,N-dimethylamine, N,N-dipropylamine, N,N-dibutylamine, N,N-dipentylamine, N,N-dihexylamine, N,N-diheptylamine, N,N-dioctylamine, N,N-dinonylamine, N,N-didecylamine, N,N-diundecylamine, N,N-didodecylamine, methylpropylamine, ethylpropylamine, propylbutylamine, ethylbutylamine, ethylpentylamine, propylpentylamine, butylpentylamine, triethylamine, tripropylamine, tributylamine, tripentylamine, trihexylamine, triheptylamine, trioctylamine, 1,2-ethylenediamine, N,N,N',N'-tetramethylethylenediamine, propane-1,3-diamine, N,N,N',N'-tetramethylpropane-1,3-diamine, butane-1,4-diamine, and N,N,N',N'-tetramethylbutane-1,4-diamine, and the like, or mixtures thereof. In specific embodiments, the silver nanoparticles are stabilized with oleic acid or hexadecylamine.

In embodiments, the stabilized silver nanoparticles are composed of elemental silver. The stabilized nanoparticles may have a silver content of about 70% or more, including from about 70% to about 90%, preferably from about 75% to about 85% by weight. This content is higher than that produced by conventional processes. The content can be analyzed with any suitable method. For example, the silver content can be obtained from TGA analysis or ashing method.

In embodiments, the stabilized silver nanoparticles have a low polarity surface, particularly silver nanoparticles stabilized with long-chain carboxylic acids and long-chain organoamine stabilizers. Polarity refers to the dipole-dipole intermolecular forces between the slightly positively-charged end of one molecule to the negative end of another or the same molecule. For example, $H_2O$ is a polar molecule while $CH_4$ is a nonpolar molecule. In embodiments, the surface of the stabilized silver nanoparticles is composed of low polarity hydrocarbon groups. Polarity affects surface tension, and can be determined by any proper approach. For example, when the stabilized silver nanoparticles were coated as a film, the surface of the film showed a very large advancing water contact angle, indicating a low surface energy and hydrophobic property.

Previously, silver nanoparticles were dissolved or dispersed in toluene or xylene to form an ink composition for printing. However, the silver nanoparticles were unstable in these solvents. For example, upon storage of the ink composition for as little as a few days, silver nanoparticles would precipitate out as pure silver in the ink container. In addition, when inkjet printed, the solids —the silver nanoparticles— accumulated at the edge of the printed drops, with a very thin layer in the center of the droplet, i.e. a large coffee ring effect occurred. Also, the resolution of printed lines was very low due to large line widths. Often, misfired drops could be observed.

In the present disclosure, the silver nanoparticles are dissolved or dispersed in a mixture of a hydrocarbon solvent and an alcohol co-solvent. This formulation provides improved ink stability and uniform printed features with no coffee-ring effect. Line widths as low as 60 microns can be achieved. In addition, this ink formulation can be jetted on a variety of substrate surfaces with different surface energies to yield the printed feature. In other words, the ink composition operates independently of the surface energy of the substrate.

In embodiments, the hydrocarbon solvent is an aliphatic hydrocarbon including saturated hydrocarbons (alkanes), unsaturated hydrocarbons (alkenes and alkynes), and cycloalkanes. Typically, the hydrocarbon solvent contains from 5 to about 20 carbon atoms. In particular embodiments, the hydrocarbon solvent is an alkane solvent. Exemplary alkane solvents include pentane, hexane, heptane, octane, nonane, decane, undecane, dodecane, tridecane, tetradecane, pentadecane, hexadecane, heptadecane, isomers thereof, and mixtures thereof. Unsaturated hydrocarbons include, for example, dodecene, tetradecene, hexadecene, heptadecene, octadecene, terpinenes, and the like. Commercial hydrocarbon solvents also include isoparaffinic solvents commercially sold under the name ISOPAR®, such as ISOPAR® C, ISOPAR® E, ISOPAR® G, ISOPAR® H, ISOPAR® K, ISOPAR® L, ISOPAR® M, and ISOPAR® V. In particular embodiments, the hydrocarbon solvent has a boiling point from about 150° C. to about 300° C. In particular embodiments, n-dodecane and ISOPAR® G are used as the aliphatic hydrocarbon solvent.

In other embodiments, the hydrocarbon solvent is an aromatic hydrocarbon solvent. Typically the aromatic hydrocarbon solvent contains from about 7 to about 20 carbon atoms. Exemplary aromatic hydrocarbon solvents include toluene, xylene, ethyltoluene, mesitylene, trimethylbenzene, diethylbenzene, tetrahydronaphthalene, and ethylbenzene, and mixtures thereof. In particular embodiments, mesitylene, trimethylbenzene, ethylbenzene, and tetrahydronaphthalene are used as the hydrocarbon solvent.

In embodiments, the alcohol co-solvent can be a primary alcohol, a secondary alcohol, and a tertiary alcohol. Typically, the alcohol co-solvent contains at least 6 carbon atoms, including from about 6 to about 20 carbon atoms. Exemplary alcohols include hexanol, heptanol, octanol, nonanol, decanol, undecanol, dodecanol, tetradecanol, and hexadecanol; a diol such as hexanediol, heptanediol, octanediol, nonanediol, and decanediol; an alcohol comprising an unsaturated double bond, such as farnesol, dedecadienol, linalool, geraniol, nerol, heptadienol, tetradecenol, hexadeceneol, phytol, oleyl alchohol, dedecenol, decenol, undecylenyl alcohol, nonenol, citronellol, octenol, and heptenol; a cycloaliphatic alcohol with or without an unsaturated double bond, such as methylcyclohexanol, menthol, dimethylcyclohexanol, methylcyclohexenol, terpineol, dihydrocarveol, isopulegol, trimethylcyclohexenol; and the like; and mixtures and isomers thereof. In particular embodiments, the alcohol co-solvent is an unsaturated alcohol comprising from about 6 to about 20 carbon atoms. Exemplary unsaturated alcohol co-solvents include farnesol, dedecadienol, linalool, geraniol, nerol, heptadienol, tetradecenol, hexadeceneol, phytol, oleyl alchohol, dedecenol, decenol, undecylenyl alcohol, nonenol, citronellol, octenol, and heptenol, methylcyclohexenol, terpineol, dihydrocarveol, isopulegol, trimethylcyclohexenol, and mixtures and isomers thereof.

In specific embodiments, the alcohol co-solvent comprises terpineol. Terpineol has at least four isomers (the alpha, beta, gamma, and 4-isomers), as shown below:

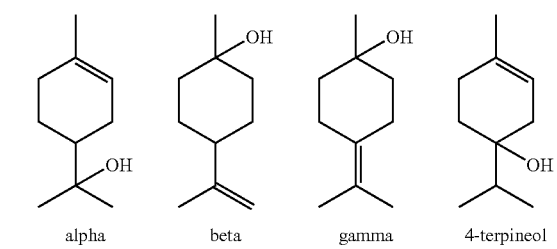

alpha    beta    gamma    4-terpineol

Generally, the terpineol solvent is a majority of the alpha-terpineol isomer when measured by weight. Put in other words, the alpha-terpineol isomer is at least about 50 weight percent of the terpineol solvent. In some embodiments, the terpineol is a mixture of the 4 isomers. In other embodiments, alpha-terpineol is used.

In embodiments, the hydrocarbon solvent has a boiling point not greater than the boiling point of the alcohol co-solvent. In further embodiments, the hydrocarbon solvent has a boiling point which is lower than the boiling point of the alcohol co-solvent by from about 20° C. to about 80° C., including from about 30° C. to about 60° C. For example, the hydrocarbon solvent dodecane, which has a boiling point of 215-217° C., can be combined with terpineol co-solvent, which has a boiling point of 219° C. The hydrocarbon solvent ISOPAR® G (boiling point of 163-176° C.) can also be combined with terpineol co-solvent. In other embodiments, the hydrocarbon solvent has a higher boiling point than the alcohol co-solvent.

In some embodiments, the silver nanoparticles have a greater solubility in the hydrocarbon solvent than the alcohol co-solvent. The silver nanoparticles (along with the stabilizers, if any) may have a solubility in the hydrocarbon solvent of from about 15% to about 85% by weight, including about 20% to about 80% by weight. The silver nanoparticles (along with the stabilizers, if any) may have a solubility in the alcohol co-solvent of from about 5% to about 60% by weight, including about 10% to about 50% by weight. In other embodiments, the alcohol co-solvent has a greater surface tension than the hydrocarbon solvent. In further embodiments, the silver nanoparticles are more soluble in the hydrocarbon solvent than the alcohol co-solvent; and the alcohol co-solvent has a greater surface tension than the hydrocarbon solvent.

The loading of the silver nanoparticles may be critical to the performance of the ink composition. Better results are obtained when the silver nanoparticles along with any stabilizer are at least about 35 weight percent of the ink composition, including from about 35 weight percent to about 70 weight percent, or from about 40 weight percent to about 60 weight percent. In addition, the weight ratio of the hydrocarbon solvent to the alcohol co-solvent may also be critical. The weight ratio of the hydrocarbon solvent to the alcohol co-solvent may be less than about 5:1, including from about 5:1 to about 1:2. In particular embodiments, the weight ratio is from about 2:1 to about 1:1. In some embodiments, the silver nanoparticles are at least about 35 weight percent of the ink composition and the weight ratio of the hydrocarbon solvent to the alcohol co-solvent is 2 or less.

The resulting ink composition may have a viscosity of from about 2 centipoise to about 15 centipoise, or from about 2 centipoise to about 10 centipoise, or from about 2 centipoise to about 6 centipoise. The ink composition may also have a surface tension of from about 20 millinewtons/meter to about 35 millinewtons/meter, including from about 20 millinewtons/meter to about 30 millinewtons/meter, or from about 22 millinewtons/meter to about 28 millinewtons/meter. As desired, other ingredients may be added to the ink composition. However, in some embodiments, the ink composition consists of silver nanoparticles, the hydrocarbon solvent, and the alcohol co-solvent.

The fabrication of conductive elements from the ink compositions of the present disclosure can be carried out using any method which can handle the viscosity of the ink. Typically, inkjet printing is used. Any type of inkjet printer, including piezoelectric printers, can be used for inkjet printing. The deposited silver nanoparticles at this stage may or may not exhibit electrical conductivity.

Any suitable jetting conditions may be used to jet the ink composition. In embodiments, the ink is printed with a piezoelectric printer head, with the printer head temperature from about 23° C. to about 45° C., preferably from about 23° C. to about 35° C. The temperature of the substrate may be from about 23° C. to about 80° C., preferably from about 40° C. to about 60° C. The drop spacing may be from about 20 microns to about 80 microns, preferably from about 20 microns to about 60 microns. In particular embodiments, the substrate temperature is from about 50° C. to about 60° C. and the drop spacing is 40 micron. The combination of drop spacing and substrate temperature will determine the width and smoothness of the printed lines.

Figure 1B:
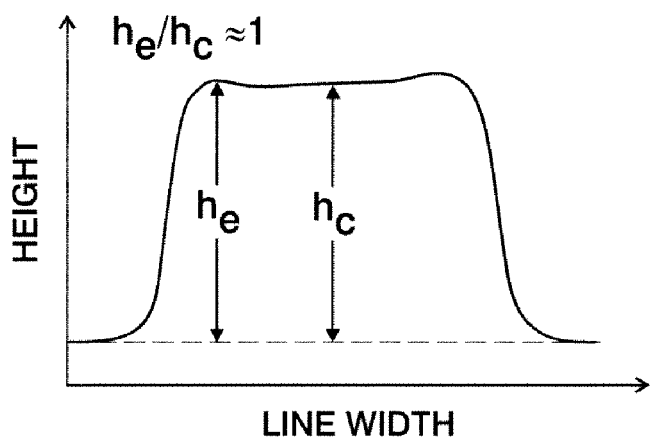
Figure 1C:
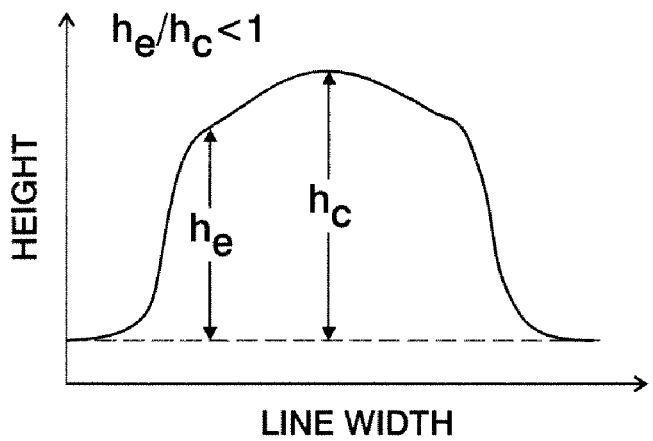

To quantify the coffee ring effect, a parameter, $h_{edge}/h_{center}$ (also referred to as $h_e/h_c$) is defined here as the ratio of the edge height to the center height. The profile of the printed feature, such as lines, can be measured using a surface profilometer. The height of the edge ($h_{edge}$) and the height of the center ($h_{center}$) can be obtained. The ratio of $h_{edge}/h_{center}$ will illustrate if there is a coffee ring effect (See FIGS. 1A-1C). As seen in FIG. 1B, when $h_{edge}/h_{center}$ is 1.0, there is no coffee ring effect and the surface of the printed line would be perfectly flat. As seen in FIG. 1A, when $h_{edge}/h_{center} \gg 1.0$, the center is much thinner than the edge, indicating a large coffee ring effect. Finally, as seen in FIG. 1C, when $h_{edge}/h_{center} < 1.0$, the center is higher than the edge. This may be acceptable for most applications as well. In embodiments, the features printed with the ink compositions of this disclosure have a $h_{edge}/h_{center}$ of around 1.0, for example from about 0.8 to about 1.2. In other embodiments, the $h_{edge}/h_{center}$ is less than 1.5.

One advantage of the ink compositions of the present disclosure is they can be printed on various substrate surfaces having different surface energies. In some embodiments, a hydrophilic surface such as plasma cleaned glass or plastic substrate is used. A surface having a low advanced water contact angle of, for example, less than 30 degrees, indicates a high surface energy. In other embodiments, a modified surface having an advancing water contact angle from about 60 degrees to about 100 degrees is used. In embodiments, the ink compositions can be printed on substrates with a large variation of water contact angle, for example from about 0 degrees to about 100 degrees, to achieve similar printed features.

Heating the deposited nanoparticles at a temperature of below about 300° C., preferably at or below about 250° C., including at or below about 150° C. causes them to coalesce to form electrically conductive layers which are suitable for use as conductive elements in electronic devices. The heating is performed for a time ranging from for example about one minute to about 10 hours, particularly from about 5 minutes to about 1 hour. The heating can be done at a temperature of from about 80° C. to about 300° C. In more specific embodiments, the heating is performed at a temperature of from about 100° C. to about 250° C. or from about 120° C. to about 200° C.

The conductivity of the resulting silver-containing elements produced by heating the deposited silver nanoparticles is, for example, at least one thousand S/cm. In other embodiments, the conductivity is at least ten thousand S/cm as measured by four-probe method.

The resulting conductive elements can be used as conductive electrodes, conductive pads, conductive lines, conductive tracks, and the like in electronic devices such as thin film transistor, organic light emitting diodes, RFID (radio frequency identification) tags, photovoltaic, and other electronic devices which require conductive elements or components. In embodiments, the printed conductive features have a thickness of from about 50 nm to about 200 nm, including from about 70 to about 150 nm. In order to achieve thick layers for certain applications, such as an antenna for RFID tags, multiple passes can be used to build up the thickness.

Figure 2:
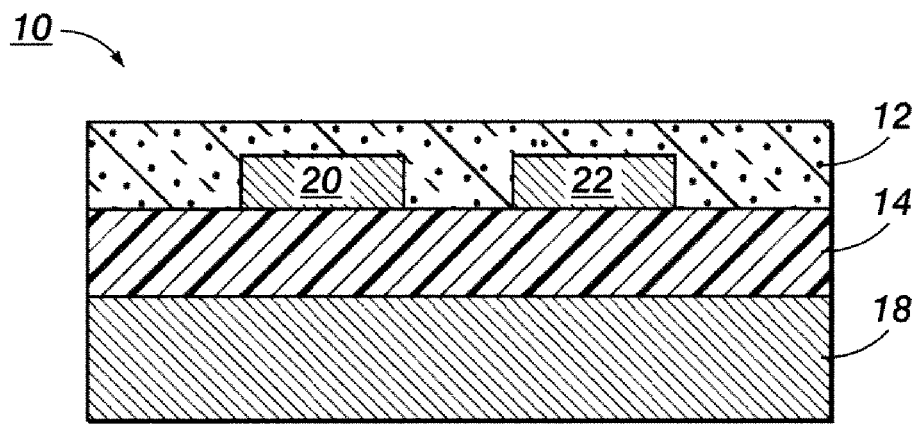
FIG. 2 represents a first embodiment of a thin film transistor containing nanoparticles of the present disclosure.

In FIG. 2, there is schematically illustrated a thin film transistor ("TFT") configuration 10 comprised of a heavily n-doped silicon wafer 18 which acts as both a substrate and a gate electrode, a thermally grown silicon oxide insulating dielectric layer 14 on top of which are deposited two metal contacts, source electrode 20 and drain electrode 22. Over and between the metal contacts 20 and 22 is a semiconductor layer 12 as illustrated herein.

Figure 3:
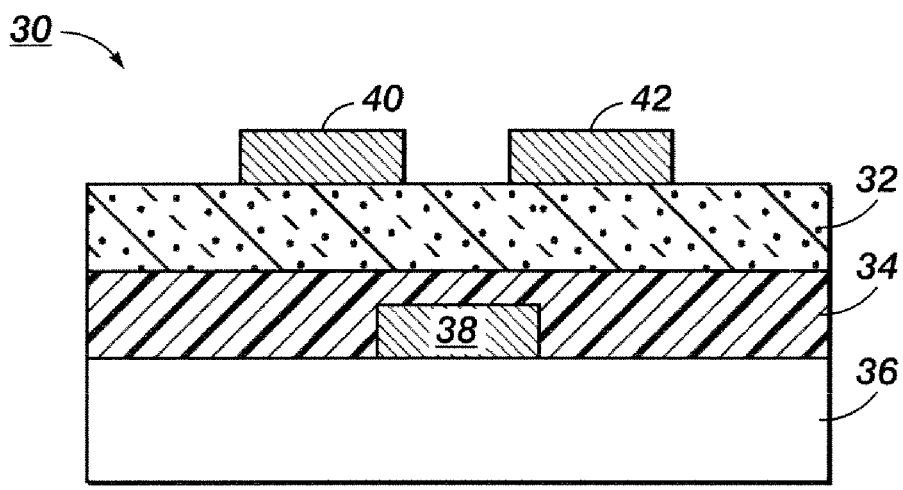
FIG. 3 represents a second embodiment of a thin film transistor containing nanoparticles of the present disclosure.

FIG. 3 schematically illustrates another TFT configuration 30 comprised of a substrate 36, a gate electrode 38, a source electrode 40 and a drain electrode 42, an insulating dielectric layer 34, and a semiconductor layer 32.

Figure 4:
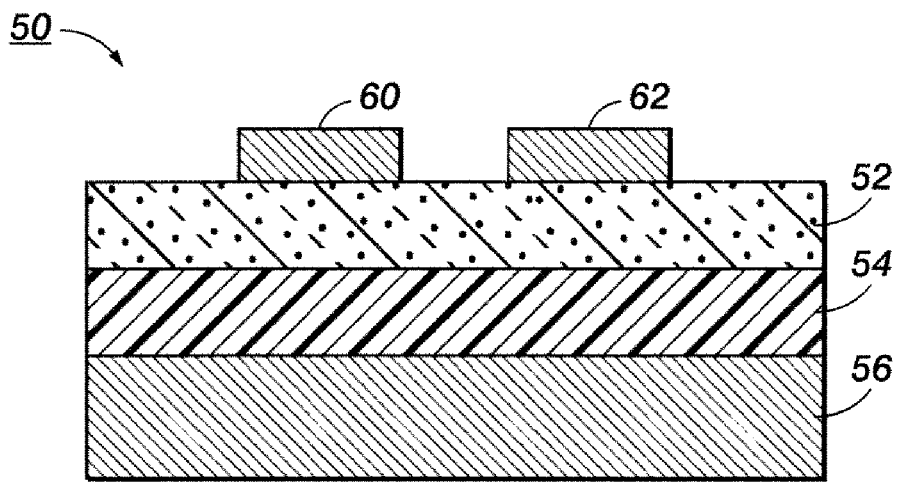
FIG. 4 represents a third embodiment of a thin film transistor containing nanoparticles of the present disclosure.

FIG. 4 schematically illustrates a further TFT configuration 50 comprised of a heavily n-doped silicon wafer 56 which acts as both a substrate and a gate electrode, a thermally grown silicon oxide insulating dielectric layer 54, and a semiconductor layer 52, on top of which are deposited a source electrode 60 and a drain electrode 62.

Figure 5:
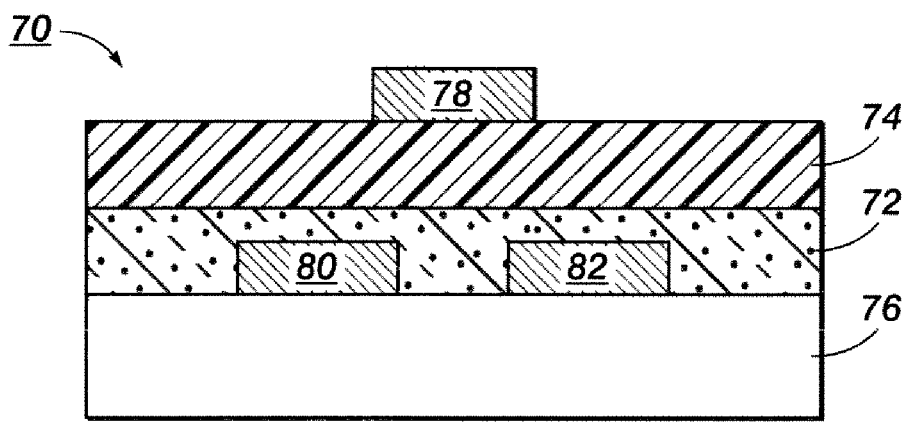
FIG. 5 represents a fourth embodiment of a thin film transistor containing nanoparticles of the present disclosure.

FIG. 5 schematically illustrates an additional TFT configuration 70 comprised of substrate 76, a gate electrode 78, a source electrode 80, a drain electrode 82, a semiconductor layer 72, and an insulating dielectric layer 74.

The substrate may be composed of, for instance, silicon, glass plate, plastic film or sheet. For structurally flexible devices, plastic substrate, such as for example polyester, polycarbonate, polyimide sheets and the like may be used. The thickness of the substrate may be from amount 10 micrometers to over 10 millimeters with an exemplary thickness being from about 50 micrometers to about 2 millimeters, especially for a flexible plastic substrate and from about 0.4 millimeters to about 10 millimeters for a rigid substrate such as glass or silicon.

The gate electrode, the source electrode, and the drain electrode are fabricated by embodiments of the present disclosure. The thickness of the gate electrode layer ranges for example from about 10 nm to about 2000 nm. Typical thicknesses of source and drain electrodes are, for example, from about 40 nm to about 1 micrometer with the more specific thickness being about 60 nm to about 400 nm.

The insulating dielectric layer generally can be an inorganic material film or an organic polymer film. Illustrative examples of inorganic materials suitable as the insulating layer include silicon oxide, silicon nitride, aluminum oxide, barium titanate, barium zirconium titanate and the like; illustrative examples of organic polymers for the insulating layer include polyesters, polycarbonates, poly(vinyl phenol), polyimides, polystyrene, poly(methacrylate)s, poly(acrylate)s, epoxy resin and the like. The thickness of the insulating layer is, for example from about 10 nm to about 500 nm depending on the dielectric constant of the dielectric material used. An exemplary thickness of the insulating layer is from about 100 nm to about 500 nm. The insulating layer may have a conductivity that is for example less than about $10^{-12}$ S/cm.

Situated, for example, between and in contact with the insulating layer and the source/drain electrodes is the semiconductor layer wherein the thickness of the semiconductor layer is generally, for example, about 10 nm to about 1 micrometer, or about 40 nm to about 100 nm. Any semiconductor material may be used to form this layer. Exemplary semiconductor materials include regioregular polythiophene, oligthiophene, pentacene, and the semiconductor polymers disclosed in U.S. Pat. Nos. 6,621,099; 6,770,904; and 6,949,762; and "Organic Thin Film Transistors for Large Area Electronics" by C. D. Dimitrakopoulos and P. R. L. Malenfant, *Adv. Mater.*, Vol. 12, No. 2, pp. 99-117 (2002), the disclosures of which are totally incorporated herein by reference. Any suitable technique may be used to form the semiconductor layer. One such method is to apply a vacuum of about $10^{-5}$ torr to $10^{-7}$ torr to a chamber containing a substrate and a source vessel that holds the compound in powdered form. Heat the vessel until the compound sublimes onto the substrate. The semiconductor layer can also generally be fabricated by solution processes such as spin coating, casting, screen printing, stamping, or jet printing of a solution or dispersion of the semiconductor.

The insulating dielectric layer, the gate electrode, the semiconductor layer, the source electrode, and the drain electrode are formed in any sequence, particularly where in embodiments the gate electrode and the semiconductor layer both contact the insulating layer, and the source electrode and the drain electrode both contact the semiconductor layer. The phrase "in any sequence" includes sequential and simultaneous formation. For example, the source electrode and the drain electrode can be formed simultaneously or sequentially. The composition, fabrication, and operation of thin film transistors are described in Bao et al., U.S. Pat. No. 6,107,117, the disclosure of which is totally incorporated herein by reference. The silver nanoparticles can be deposited as a layer upon any suitable surface, such as the substrate, the dielectric layer, or the semiconductor layer.

The following examples are for purposes of further illustrating the present disclosure. The examples are merely illustrative and are not intended to limit devices made in accordance with the disclosure to the materials, conditions, or process parameters set forth therein.

EXAMPLES

Example 1

Two ink compositions were formulated. Composition A contained 40 wt % oleic acid stabilized silver nanoparticles and 60 wt % xylene. Composition B contained 40 wt % oleic acid stabilized silver nanoparticles, 40 wt % dodecane, and 20 wt % terpineol.

Oleic acid stabilized silver nanoparticles were prepared as follows: Silver acetate was fully dissolved into a mixture of toluene and oleylamine at 50° C. Phenylhydrazine diluted in toluene was then added drop-wise followed by 30 minutes of mixing at the same temperature. The reaction solution was cooled down to room temperature. Next, a mixture of acetone and methanol (1:1 v/v) was added with stirring to precipitate the oleylamine-stabilized silver nanoparticles. The product was filtered and washed three times with acetone and methanol. The silver nanoparticles were then dissolved in toluene and oleic acid was added to the solution, followed by 30 minutes of mixing. Oleic acid-stabilized silver nanoparticles were precipitated by the addition of a mixture of acetone/methanol (1:1 v/v), filtered, washed with methanol 3 times, and vacuum dried at room temperature overnight.

The two ink compositions were then used to print a line using a Dimatix DMP-2800 inkjet printer with a 10 picoliter cartridge. The lines are seen in FIGS. 6A and 6B.

Figure 6A:
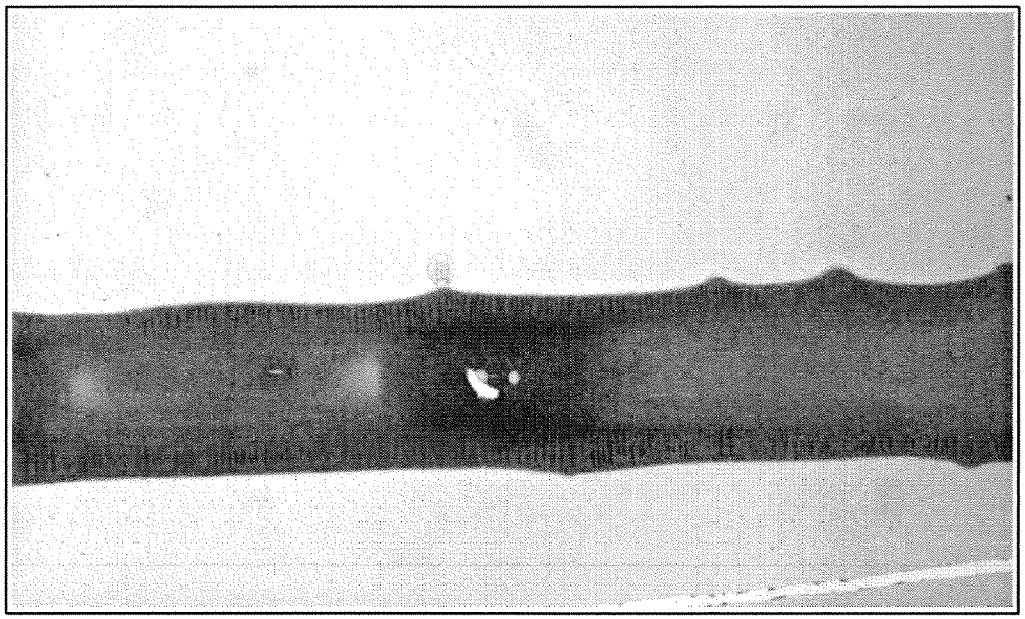
FIGS. 6A and 6B are photographs of lines printed using ink compositions of the prior art and the present disclosure, respectively.
Figure 6B:
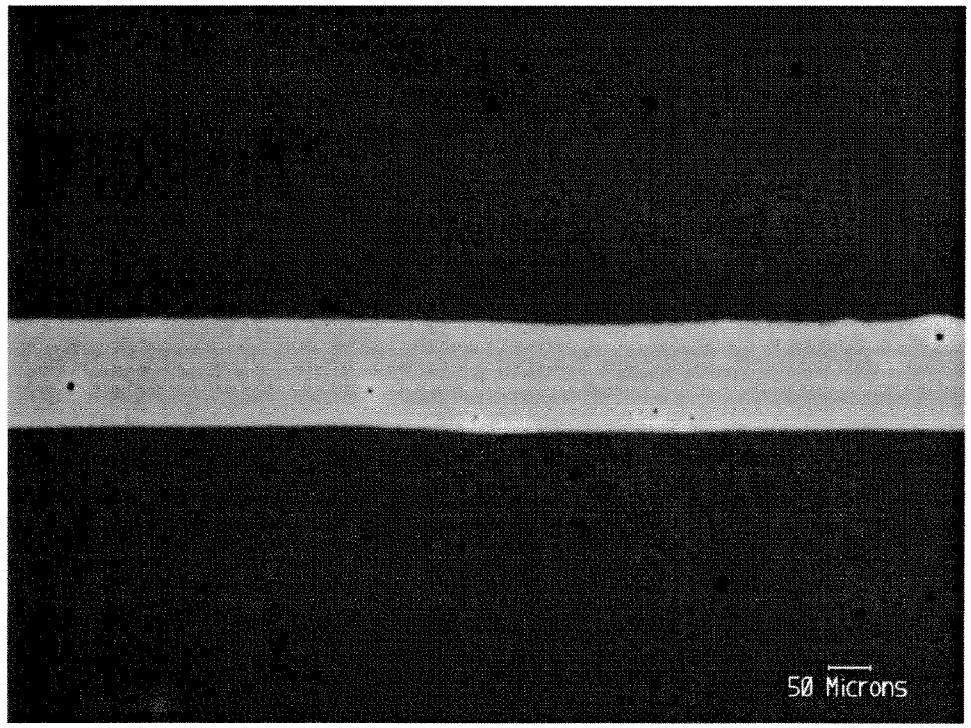

As seen in FIG. 6A, Composition A printed a line about 150-200 microns in width. The thickness of the line was not very uniform; the edges were thick, while the center was thin. In FIG. 6B, the line of Composition B was much narrower, being about 100 microns in width. The line was also more uniform and the edges were smooth. No coffee ring effect was observed.

Example 2

Composition B was then printed on two different substrates to show the effect of the surface energy of the substrate on the line width of the ink composition. A plasma cleaned glass substrate was used as a hydrophilic surface. A glass substrate modified by either hexamethyldisilazane or octyltrichlorosilane was used as a hydrophobic surface.

Figure 7:
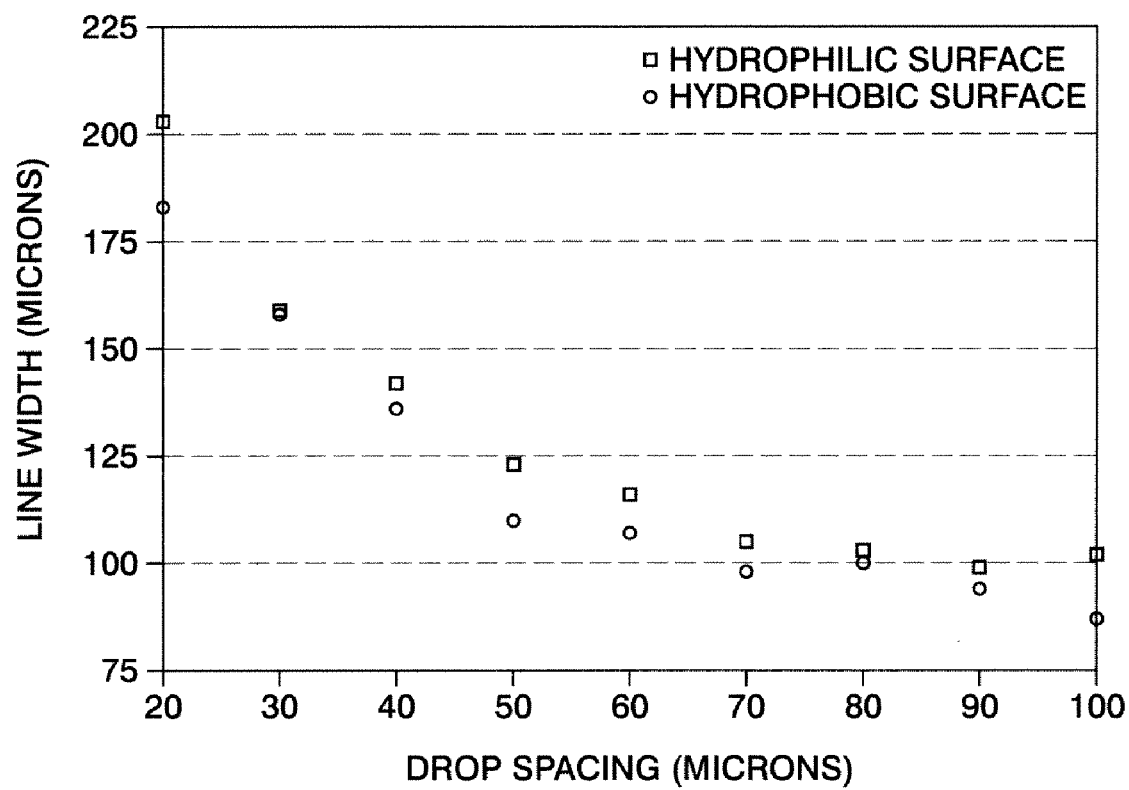
FIG. 7 is a graph showing the line width versus drop spacing for an exemplary ink composition of the present disclosure on both hydrophilic and hydrophobic surfaces.

FIG. 7 is a graph showing the line width versus the drop spacing for Composition B on each surface. Similar line widths were achieved on both hydrophilic and hydrophobic surfaces over a wide range of drop spacings. This indicated that Composition B was surface energy independent. This is a very important feature, because it means Composition B and similar ink compositions can be used to print electronic components on different surfaces having variable surface energies.

Example 3

Nine ink compositions were made. They varied in the amount of silver nanoparticles and the weight ratio of dodecane to terpineol. Lines were printed with the ink compositions and annealed at 210° C. for 30 minutes, and the yield of conductive lines (i.e. whether the line was conductive or not) was measured. The results are shown in Table 1.

TABLE 1

| dodecane/terpineol weight ratio | Silver nanoparticle content | | |
|---|---|---|---|
| | 25 wt % | 30 wt % | 40 wt % |
| 5:1 | None | None | None |
| 2:1 | None | 50-60% | 100% |
| 1:1 | None | 50-60% | 100% |

As seen here, when the relative amount of terpineol was low (ratio of 5:1), none of the printed lines were conductive. Similarly, when the loading of silver nanoparticles was low (25 wt %), no printed lines were conductive. At higher loadings of silver nanoparticles and higher amounts of terpineol, all printed lines were conductive.

Example 4

Hexadecylamine stabilized silver nanoparticles were used in this Example. The ink compositions contained 40 wt % silver nanoparticles, terpineol, and a hydrocarbon solvent. The ratio of hydrocarbon solvent to terpineol was 2:1. The identity of the hydrocarbon solvent was varied to determine its effect. The temperature of the substrate was also varied. Lines were printed and the line width and coffee ring effect were evaluated. The results are shown in Table 2.

TABLE 2

| Hydrocarbon solvents | Boiling point (° C.) | Line width (μm), and $h_{edge}/h_{center}$ ratio | | |
|---|---|---|---|---|
| | | Substrate temp of 40° C. | Substrate temp of 50° C. | Substrate temp of 60° C. |
| Hexadecane | 287 | 105, 1.25 | 140, 1.8 | 129, 2.1 |
| Dodecane | 215-217 | 114, 1.9 | 98, 2.0 | 86, 2.2 |
| ISOPAR ® G | 163-176 | 108, 0.83 | 81, 0.87 | 69, 1.45 |

As seen here, increased substrate temperature reduced the printed line width. The use of hydrocarbon solvent with boiling point higher or lower than that of terpineol (219° C.) helped reduce the coffee ring effect (small $h_{edge}/h_{center}$ ratio). In particular, the combination of ISOPAR® G and terpineol offered both narrow lines and reduced the coffee ring effect.

Example 5

ISOPAR® G and terpineol were used as solvents with ISOPAR® G to terpineol ratio of 2:1. 50 wt % hexadecylamine stabilized silver nanoparticles were used to formulate the ink. Lines were printed, showing a further reduction in line width to 57 micrometers with the $h_{edge}/h_{center}$ of 1.02 at substrate temperature of 60° C.

Example 6

Mesitylene and o-xylene were used as the hydrocarbon solvents and terpineol was used as the co-solvent at a ratio of 2:1. 50 wt % hexadecylamine stabilized silver nanoparticles were used. Lines were printed. The ink formulation with mesitylene yielded a line width of 40 to 45 micrometers and the ink formulation with xylene yield a line width around 30 micrometers at substrate temperature of 60° C.

While particular embodiments have been described, alternatives, modifications, variations, improvements, and substantial equivalents that are or may be presently unforeseen may arise to applicants or others skilled in the art. Accordingly, the appended claims as filed and as they may be amended are intended to embrace all such alternatives, modifications variations, improvements, and substantial equivalents.

The invention claimed is:

1. An ink composition comprising:
   silver nanoparticles;
   a hydrocarbon solvent;
   and an alcohol co-solvent;
   wherein the silver nanoparticles are present in an amount of at least 35 weight percent of the ink composition; and
   wherein the weight ratio of hydrocarbon solvent to alcohol co-solvent is from about 2:1 to about 1:1.

2. The ink composition of claim 1, wherein the silver nanoparticles are stabilized with a carboxylic acid or an organoamine.

3. The ink composition of claim 2, wherein the carboxylic acid is selected from butyric acid, pentanoic acid, hexanoic acid, heptanoic acid, octanoic acid, nonanoic acid, decanoic acid, undecanoic acid, dodecanoic acid, tridecanoic acid, myristic acid, pentadecanoic acid, palmitic acid, heptadecanoic acid, stearic acid, oleic acid, nonadecanoic acid, icosanoic acid, eicosenoic acid, elaidic acid, linoleic acid, palmitoleic acid, citronellic acid, geranic acid, undecenoic acid, lauric acid, undecylenic acid, isomers thereof, and mixtures thereof, and the organoamine is selected from propylamine, butylamine, pentylamine, hexylamine, heptylamine, octylamine, nonylamine, decylamine, undecylamine, dodecylamine, tridecylamine, tetradecylamine, pentadecylamine, hexadecylamine, heptadecylamine, octadecylamine, N,N-dimethylamine, N,N-dipropylamine, N,N-dibutylamine, N,N-dipentylamine, N,N-dihexylamine, N,N-diheptylamine, N,N-dioctylamine, N,N-dinonylamine, N,N-didecylamine, N,N-diundecylamine, N,N-didodecylamine, methylpropylamine, ethylpropylamine, propylbutylamine, ethylbutylamine, ethylpentylamine, propylpentylamine, butylpentylamine, triethylamine, tripropylamine, tributylamine, tripentylamine, trihexylamine, triheptylamine, trioctylamine, 1,2-ethylenediamine, N,N,N',N'-tetramethylethylenediamine, propane-1,3-diamine, N,N,N,N'-tetramethylpropane-1,3-diamine, butane-1,4-diamine, and N,N,N',N'-tetramethylbutane-1,4-diamine, and mixtures thereof.

4. The ink composition of claim 1, wherein the silver nanoparticles have a particle size from about 1 nm to about 50 nm.

5. The ink composition of claim 1, wherein the silver nanoparticles have a low polarity surface composed of hydrocarbon groups.

6. The ink composition of claim 1, wherein the hydrocarbon solvent is an aliphatic hydrocarbon having at least 5 carbon atoms to about 20 carbon atoms.

7. The ink composition of claim 6, wherein the aliphatic hydrocarbon is selected from the group consisting of pentane, hexane, heptane, octane, nonane, decane, undecane, dodecane, tridecane, tetradecane, pentadecane, hexadecane, heptadecane, dodecene, tetradecene, hexadecene, heptadecene, octadecene, terpinenes, isoparaffinic solvents, and their isomers.

8. The ink composition of claim 1, wherein the alcohol co-solvent has at least 6 carbon atoms.

9. The ink composition of claim 1, wherein the alcohol co-solvent is selected from the group consisting of hexanol, heptanol, octanol, nonanol, decanol, undecanol, dodecanol, tetradecanol, hexadecanol, hexanediol, heptanediol, octanediol, nonanediol, decanediol, farnesol, dedecadienol, linalool, geraniol, nerol, heptadienol, tetradecenol, hexadecenol, phytol, oleyl alcohol, dedecenol, decenol, undecylenyl alcohol, nonenol, citronellol, octenol, heptenol, methylcyclohexanol, menthol, dimethylcyclohexanol, methylcyclohexenol, terpineol, dihydrocarveol, isopulegol, cresol, and trimethylcyclohexenol.

10. The ink composition of claim 1, wherein the alcohol co-solvent is a terpineol solvent comprising a majority of alpha-terpineol by weight.

11. The ink composition of claim 1, wherein the ink composition has a viscosity of from about 2 to about 15 centipoise.

12. The ink composition of claim 1, wherein the ink composition has a surface tension of from about 22 to about 35 millinewtons/meter.

13. The ink composition of claim 1, wherein the boiling point of the hydrocarbon solvent is not greater than the boiling point of the alcohol co-solvent.

14. The ink composition of claim 1, wherein the silver nanoparticles are more soluble in the hydrocarbon solvent than the alcohol co-solvent; and wherein the alcohol co-solvent has a higher surface tension than the hydrocarbon solvent.

15. An ink composition comprising:
oleic acid stabilized silver nanoparticles;
dodecane; and
terpineol;
wherein the silver nanoparticles comprise from about 35 weight percent to about 60 weight percent of the ink composition, and the weight ratio of dodecane to terpineol is from about 2:1 to about 1:1.

16. The ink composition of claim 1, wherein the alcohol co-solvent is alpha-terpineol, beta-terpineol, gamma-terpineol, or 4-terpineol.

17. The ink composition of claim 1, wherein the ink composition consists of the silver nanoparticles, hydrocarbon solvent, and alcohol co-solvent.

18. The ink composition of claim 1, wherein the silver nanoparticles are present in an amount of about 40 weight percent of the ink composition.

19. The ink composition of claim 1, wherein the silver nanoparticles are present in an amount of from about 40 to about 70 weight percent of the ink composition.

* * * * *